United States Patent
Yang

(10) Patent No.: US 9,087,598 B2
(45) Date of Patent: *Jul. 21, 2015

(54) RELIABILITY METRICS MANAGEMENT FOR SOFT DECODING

(71) Applicant: Marvell World Trade LTD., St. Michael (BB)

(72) Inventor: Xueshi Yang, Cupertino, CA (US)

(73) Assignee: Marvell World Trade Ltd., St. Michael (BB)

(*) Notice: Subject to any disclaimer, the term of this patent is extended or adjusted under 35 U.S.C. 154(b) by 0 days.

This patent is subject to a terminal disclaimer.

(21) Appl. No.: 14/194,388

(22) Filed: Feb. 28, 2014

(65) Prior Publication Data

US 2014/0185386 A1 Jul. 3, 2014

Related U.S. Application Data

(63) Continuation of application No. 13/397,434, filed on Feb. 15, 2012, now Pat. No. 7,665,650.

(60) Provisional application No. 61/444,534, filed on Feb. 18, 2011.

(51) Int. Cl.
G11C 16/06 (2006.01)
G11C 16/28 (2006.01)
G11C 29/00 (2006.01)
(Continued)

(52) U.S. Cl.
CPC ............ *G11C 16/28* (2013.01); *G06F 11/1048* (2013.01); *G11C 16/26* (2013.01); *G11C 29/00* (2013.01)

(58) Field of Classification Search
CPC .... G11C 11/5642; G11C 16/28; G11C 29/00; G11C 29/52

USPC ............... 365/185.2, 185.21, 185.09, 210.01, 365/189.09, 230.06
See application file for complete search history.

(56) References Cited

U.S. PATENT DOCUMENTS 7,551,478 B2  6/2009  Kanno
7,688,634 B2 * 3/2010  Richter et al. ............. 365/185.2
7,903,468 B2  3/2011  Litsyn et al.
(Continued)

FOREIGN PATENT DOCUMENTS

WO  W02007049272 A2  5/2007
WO  W02008053472 A2  5/2008

OTHER PUBLICATIONS

PCT Search Report and Written Opinion mailed May 4, 2012 for PCT application No. PCT/US12/25482, 10 pages.

*Primary Examiner* — David Lam

(57) ABSTRACT

Embodiments provide a method for reading a target memory sector of a memory. The method comprises, based on read data corresponding to a plurality of memory sectors of the memory, estimating first one or more reference voltages and, using the first one or more reference voltages, performing a first read operation on the target memory sector. The method further comprises determining an error correcting code (ECC) decoding failure of the first read operation and, in response to determining the ECC decoding failure of the first read operation and based on read data corresponding to the target memory sector, updating the estimate of the first one or more reference voltages to generate second one or more reference voltages. The method also comprises using the second one or more reference voltages, performing a second read operation on the target memory sector.

20 Claims, 8 Drawing Sheets

(51) Int. Cl.
    *G06F 11/10*     (2006.01)
    *G11C 16/26*     (2006.01)

(56) References Cited

U.S. PATENT DOCUMENTS

| | | | |
|---|---|---|---|
| 8,072,805 | B2 | 12/2011 | Chou et al. |
| 8,156,403 | B2 | 4/2012 | Shalvi et al. |
| 8,259,497 | B2 | 9/2012 | Shalvi et al. |
| 8,576,625 | B1 | 11/2013 | Yang et al. |
| 8,665,650 | B2 * | 3/2014 | Yang .......... 365/185.2 |
| 2007/0174740 | A1 | 7/2007 | Kanno |
| 2009/0003058 | A1 | 1/2009 | Kang |
| 2009/0199074 | A1 | 8/2009 | Sommer |
| 2009/0292972 | A1 | 11/2009 | Seol et al. |
| 2011/0038205 | A1 | 2/2011 | Chou et al. |
| 2012/0213001 | A1 | 8/2012 | Yang |

\* cited by examiner

RELIABILITY METRICS MANAGEMENT FOR SOFT DECODING

CROSS-REFERENCES TO RELATED APPLICATIONS

The present disclosure is a continuation of and claims priority to U.S. patent application Ser. No. 13/397,434, filed Feb. 15, 2012, now U.S. Pat. No. 8,665,650, issued on Mar. 4, 2014, which claims priority to U.S. Provisional Patent Application No. 61/444,534, filed Feb. 18, 2011, the entire disclosure of which is hereby incorporated by reference in its entirety except for those sections, if any, that are inconsistent with this disclosure. The present disclosure is related to U.S. patent application Ser. No. 12/552,925, filed Sep. 2, 2009; to U.S. patent application Ser. No. 12/959,891, filed Dec. 3, 2010; to U.S. patent application Ser. No. 13/017,430, filed Jan. 31, 2011; to U.S. patent application Ser. No. 13/089,135, filed Apr. 8, 2011; and to U.S. patent application Ser. No. 13/167,896, filed Jun. 24, 2011, which are incorporated herein by reference.

TECHNICAL FIELD

Embodiments of the present disclosure relate to the field of soft decoding, and more particularly, to management of reliability metrics for soft decoding.

BACKGROUND

The background description provided herein is for the purpose of generally presenting the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

A memory device (e.g., a flash memory) generally includes a plurality of memory sectors, where each memory sector includes a plurality of memory cells. Data is stored by programming the memory cells to different voltage levels. A k-bits-per-cell flash memory device (where K is an appropriate integer) stores k bits in a single cell and has $2^k$ voltage regions, with each region corresponding to one of the possible $2^k$ k-bit patterns. A k-bit pattern is stored by programming the memory cell to a nominal voltage value in the corresponding voltage region. The actual stored voltage within a particular memory cell is subject to noise and hence can differ from the nominal value. The exact value of the stored voltage cannot be read out directly, but can only be compared to a read reference voltage. Also, during a read operation, the primary goal is to find the k-bit pattern corresponding to the stored voltage, rather than the voltage itself. Therefore, a memory cell is read by comparing the stored voltage values in the memory cell to one or more read reference voltages.

A floating-gate transistor of a memory cell in a flash memory device is capable of storing a voltage on its floating gate for a period, typically many years. The threshold voltages that correspond to the stored charge on the floating gate of the floating-gate transistor may change over time due to, for example, physical changes in the device. Such physical changes may result from device aging, repeated erase and program cycles, and so forth. A group of flash memory cells may therefore exhibit a change in their overall threshold voltage distributions over time. Such changes may result in greater error rates, which may worsen as the device ages.

SUMMARY

In various embodiments, there is provided a method for reading a target memory sector of a memory. The method comprises, based on read data corresponding to a plurality of memory sectors of the memory, estimating first one or more reference voltages and, using the first one or more reference voltages, performing a first read operation on the target memory sector. The method further comprises determining an error correcting code (ECC) decoding failure of the first read operation and, in response to determining the ECC decoding failure of the first read operation and based on read data corresponding to the target memory sector, updating the estimate of the first one or more reference voltages to generate second one or more reference voltages. The method also comprises using the second one or more reference voltages, performing a second read operation on the target memory sector.

In accordance with an embodiment, the method further comprises, based on the read data corresponding to the plurality of memory sectors, estimating a first set of log-likelihood ratios (LLRs) corresponding to the first one or more reference voltages, wherein an LLR is an indication of a confidence for each data bit read from a memory cell for a given range of reference voltages. In accordance with the embodiment, determining the ECC decoding failure of the first read operation further comprises determining the ECC decoding failure of the first read operation while ECC decoding the results of the first read operation using the first set of LLRs and the method further comprises, in response to determining the ECC decoding failure of the first read operation and based on the read data corresponding to the target memory sector, updating the estimate of the first set of LLRs to generate a second set of LLRs. In accordance with the embodiment, the performing the second read operation further comprises ECC decoding the results of the second read operation using the second set of LLRs.

The present disclosure also provides a memory system comprising a memory comprising a target sector. The memory system also comprises a read module and an estimation module configured to, based on read data corresponding to a plurality of memory sectors of the memory, estimate first one or more reference voltages. The memory system further comprises a decoder module. The read module is configured to perform, using the first one or more reference voltages, a first read operation on a target memory sector of the memory. In response to the decoder module determining an error correcting code (ECC) failure of the first read operation and based on read data corresponding to the target memory sector, the estimation module is further configured to update the estimate of the first one or more reference voltages to generate second one or more reference voltages. Using the second one or more reference voltages, the read module is further configured to perform a second read operation on the target memory sector.

In accordance with an embodiment, based on the read data corresponding to the plurality of memory sectors, the estimation module is further configured to estimate a first set of log-likelihood ratios (LLRs) corresponding to the first one or more reference voltages, wherein an LLR is an indication of a confidence for a given range of reference voltages. In accordance with the embodiment, in response to the decoder module failing to ECC decode results of the first read operation using the first set of LLRs and based on the read data corresponding to the target memory sector, the estimation module is further configured to update the estimate of the first set of LLRs to generate a second set of LLRs. Also, in accordance with the embodiment, using the second set of LLRs, the decoder module is further configured to ECC decode results of the second read operation.

BRIEF DESCRIPTION OF THE DRAWINGS

Embodiments will be readily understood by the following detailed description in conjunction with the accompanying drawings. Embodiments are illustrated by way of example and not by way of limitation in the figures of the accompanying drawings.

DETAILED DESCRIPTION

Figure 1:
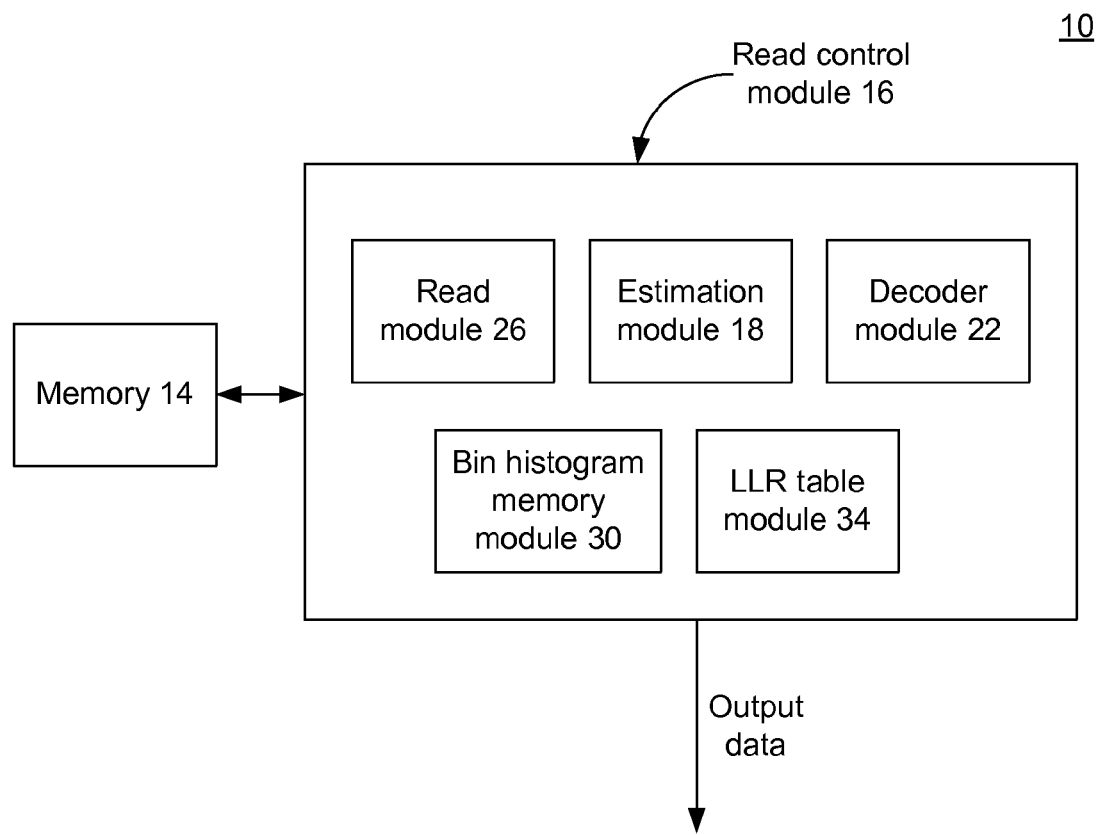
FIG. 1 schematically illustrates an example of a memory system.

FIG. 1 schematically illustrates an example of a memory system 10. The memory system 10 includes a memory 14. The memory 14 is any appropriate type of memory, e.g., a volatile memory (e.g., an appropriate type of random-access memory), a non-volatile memory (e.g., a read-only memory), or the like. In an embodiment, the memory 14 is an electrically-erasable programmable read-only memory (EE-PROM), e.g., a flash memory.

Although not illustrated in FIG. 1, the memory 14 includes a plurality of memory sectors, where each memory sector includes a plurality of memory cells, with each memory cell storing one or more bits of data. For example, individual memory cells of the memory 14 can be a single-level cell (SLC), which stores a single bit of data. In another example, individual memory cells of the memory 14 can be a multi-level cell (MLC), which stores more than one bit of data. In an embodiment, a memory sector corresponds to a memory page of the memory 14. In an embodiment, all memory cells included in a memory sector are read during a single read cycle.

The memory system 10 includes a read control module 16, which comprises an estimation module 18, a decoder module 22, a read module 26, a bin histogram memory module 30, and an LLR table module 34. The read control module 16 is configured to read and decode data from the memory 14. Although not illustrated in FIG. 1, the memory system 10 also includes a write control module configured to write data in the memory 14 (e.g., possibly after encoding and/or encrypting the data).

In various embodiments, data is read by the read control module 16 from the memory 14 in the unit of memory sectors. That is, data bits from memory cells of a memory sector of the memory 14 are read during a single read cycle. During a read cycle, the read module 26 applies a reference voltage to individual memory cells of a memory sector. For a given memory cell, the read module 26 determines whether a voltage level of the memory cell is higher or lower compared to the applied reference voltage. Based on this determination, the estimation module 18 and/or the decoder module 22 estimates whether a bit zero or a bit one is stored in the memory cell, e.g., if the memory cell is a SLC. If the memory cell is a MLC, multiple reference voltages are applied to estimate the bits stored in the memory cell. Thus, a read cycle is associated with one or more reference voltages, which are applied to the memory cells of a memory sector of the memory 14 during the read cycle.

The estimation module 18 provides a soft estimation for the data bits of the memory cells of a memory sector of the memory 14, when the read module 26 reads data from the memory sector of the memory 14. That is, the estimation module 18 provides in the form of log-likelihood ratios (LLRs), probability of each data bit being 0 or 1. The LLRs are indicative of a confidence in zero ('0') or one ('1') for each data bit read from the memory 14. Based on the estimated LLRs for the data bits, the decoder module 22 decodes the data. Estimation of LLRs directly affects the decoder performance, and the performance of the memory system 10. LLR for a data bit may be defined as $$LLR = \log\left(\frac{\text{Probability of the data bit being equal to } 0}{\text{Probability of the data bit being equal to } 1}\right).$$

Thus, a positive LLR indicates a greater probability of the data bit being equal to 0, and a negative LLR indicates a greater probability of the data bit being equal to 1. That is, a sign of the LLR provides an estimation of the data bit, and a magnitude of the LLR provides a reliability of the estimation (e.g., |LLR|=0 means the estimation is completely unreliable, and |LLR|=∞ means that the estimation is completely reliable and the bit value is known).

The decoder module 22 performs a decoding operation using iterative soft decoding techniques. For example, the decoder module 22 employs error correcting codes (ECC) such as, for example, low density parity check (LDPC) codes, Reed-Solomon (RS) codes, Turbo codes, or any other appropriate iterative soft decoding codes for ECC decoding of data.

As will be described in more detail herein, the bin history memory 30 stores bin indices for various bin histograms corresponding to probability density functions (PDFs) associated with probabilities of a data bit being 0 or 1, as a function of voltage. Also, the LLR table module 34 includes a look up table (LUT) that maps bin indices of bin histograms to corresponding LLRs that correspond to the probability of each data bit being 0 or 1.

Figure 2:
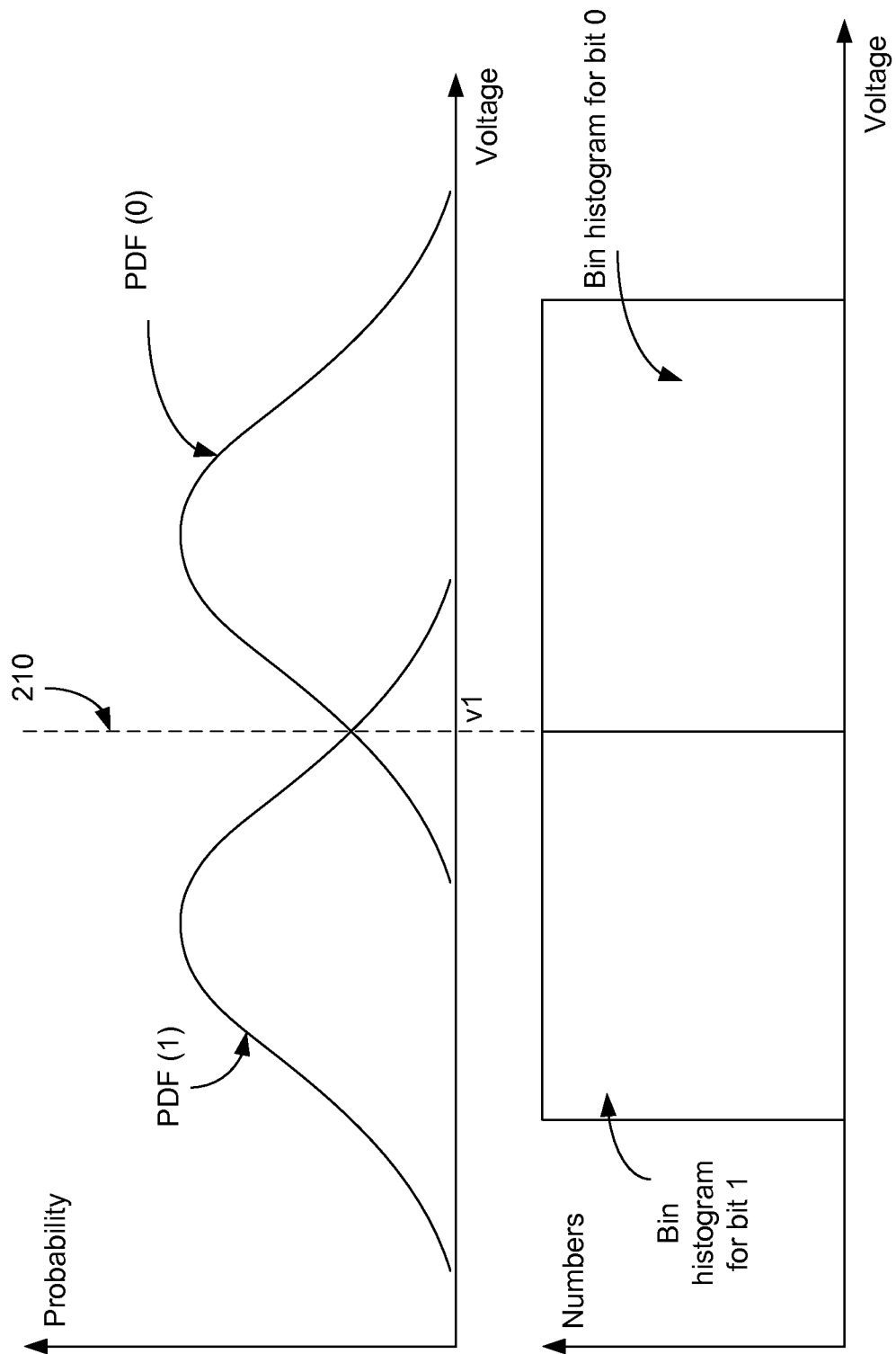
FIGS. 2 and 3 schematically illustrate probability density functions (PDFs) associated with probabilities of data bits being 0 or 1, as a function of voltage, and also illustrate corresponding bin histograms.

FIG. 2 schematically illustrates PDFs associated with probabilities of a data bit being 0 or 1, as a function of voltage, and also illustrates corresponding bin histograms. In the example PDFs of FIG. 2, it is assumed that the memory cells of the memory 14 are SLCs (although, in another embodiment, the memory cells of the memory 14 may be MLCs).

There are two graphs in FIG. 2, with the top graph illustrating the PDFs and the bottom graph illustrating the bin histograms. The voltage in the top graph of FIG. 2 is a voltage level of individual memory cells. The PDF (1) is a PDF for a data bit in a memory cell being 1, and the PDF (0) is a PDF for the data bit being 0. For example, if the voltage level of a memory cell is relatively high, the associated data bit is 0 with high probability; and if the voltage level is relatively low, the data bit is 1 with high probability (although in other embodiments, the opposite may also be possible based on, for example, configuration of the memory 14). The illustrated PDFs are bell shaped, but any other shapes are also possible. Also, the two PDFs are illustrated to be symmetrical, although in some embodiments the two PDFs may not be symmetrical.

In FIG. 2, a vertical dotted line 210 passes through a point of intersection of the PDF (1) and the PDF (0). The line 210 corresponds to a reference voltage v1 applied to memory cells of a memory sector during a read cycle. For a given memory cell, the read module 26 determines whether a voltage level of the memory cell is higher or lower compared to the applied reference voltage v1. For each memory cell, based on such determination, one of the two bin histograms is incremented by one. For example, the bin histogram on the right of the dotted line 310 is incremented by one if the voltage level of the memory cell is determined to be higher compared to the applied reference voltage v1, and vice versa. Also, based on the assumption that memory cells storing bit 0 has a higher voltage level than memory cells storing bit 1 (as also illustrated in the two PDFs, although such an assumption is merely an example and is not limiting on the teachings of this disclosure), the bin histogram to the right of the dotted line 210 is assigned as bin histogram for bit 0 (hereinafter also referred to as bin histogram 0) and the bin histogram to the left of the dotted line 210 is assigned as bin histogram for bit 1 (hereinafter also referred to as bin histogram 1). Thus, based on applying the reference voltage v1, the read module 26 estimates whether a memory cell stores bit 0 or bit 1, and increments one of the two bin histograms accordingly. The bin histogram 0, thus, reflects a count of memory cells in a memory sector that have higher voltages compared to the applied reference voltage, and accordingly, reflects a count of memory cells in the memory sector that stores bit 0. Similarly, the bin histogram 1 reflects a count of memory cells in the memory sector that have lower voltages compared to the applied reference voltage, and accordingly, reflects a count of memory cells in the memory sector that stores bit 1.

As the two PDFs of FIG. 2 are symmetrical and as the line 210 passes through the point of intersection of the two PDFs, about half the data bits will be estimated as 0 and about half the data bits will be estimated as 1 (assuming that the number of 0's and 1's stored in the memory sector are almost equal). Thus, as illustrated in FIG. 2, the two bin histograms have almost same height. The voltage v1 represents an optimal reference voltage for applying to the memory sectors of the memory 14 during read cycles.

In practice, the PDF (1) and PDF (0) are usually not known for the memory system 10. Accordingly, the reference voltage v1 (which represents the optimal reference voltage for applying to the memory sectors of the memory 14 during a read cycle) is also not known during the read operations of the memory 14. Furthermore, the optimal reference voltage can change with time for a flash memory (e.g., as the flash memory undergoes more and more number of write, retention and/or read cycles), can vary between two memory sectors of the memory 14, and can also vary between two memory cells of a single memory sector. Accordingly, it is usually not possible to know a priori the optimal reference voltage v1, and accordingly, not possible to correctly apply the optimal reference voltage v1 to the memory 14 during read cycles.

Figure 3:
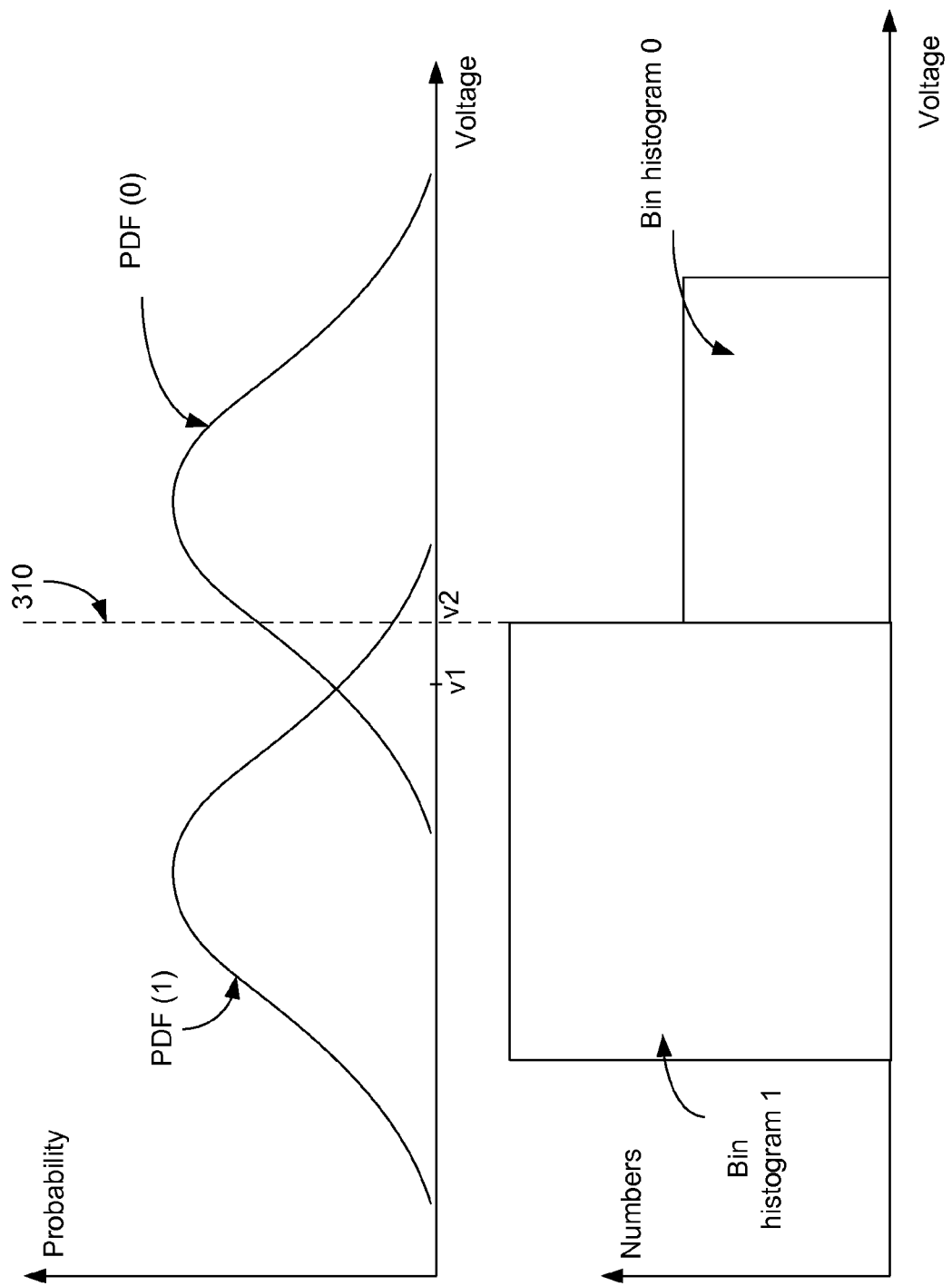

Accordingly, in practice, during a read cycle, a reference voltage v2 is applied to a memory sector of the memory 14, where the reference voltage v2 can be different from the optimal reference voltage v1, as illustrated in FIG. 3 (e.g., v2 is greater than v1 in the example of FIG. 3). As the reference voltage v2 in FIG. 3 is greater than the optimal reference voltage v1, a probability of determining a data bit as 1 increases (e.g., compared to a probability of determining a data bit as 0), resulting in a higher height of the bin histogram 1 compared to the bin histogram 0, as illustrated in the bottom graph in FIG. 3. That is, as the reference voltage v2 is greater than the optimal reference voltage v1, some data bits that are actually 0 are now erroneously estimated as bit 1, thereby increasing the height of the bin histogram 1.

Figure 4:
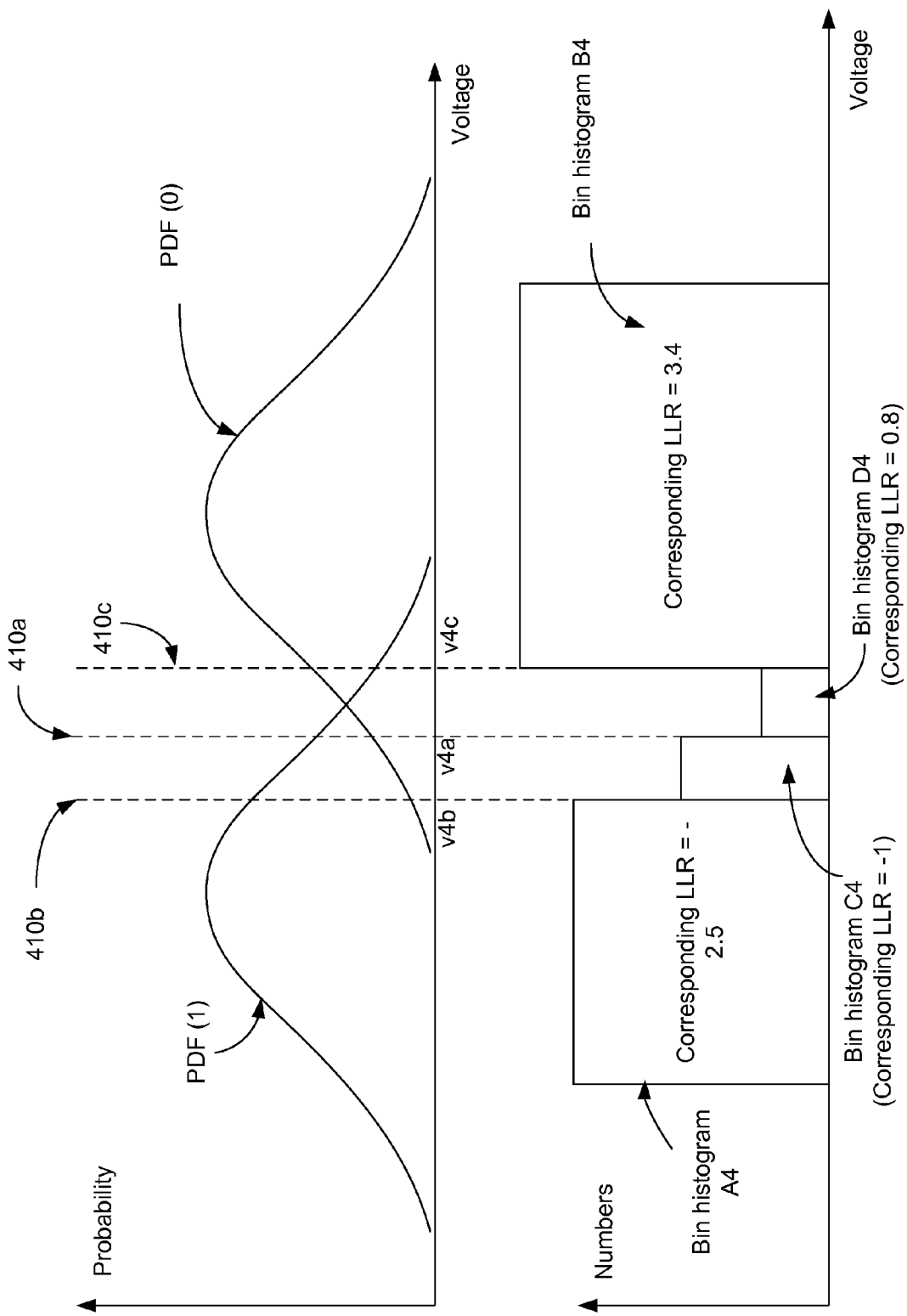
FIG. 4 illustrates bin histograms corresponding to three read cycles, during which three reference voltages are applied to memory cells of one or more memory sectors of a memory.

FIG. 4 illustrates bin histograms corresponding to three read cycles, during which three reference voltages are applied to the memory cells of one or more memory sectors of the memory 14. For example, during a first read cycle, a reference voltage v4a is applied. During the first read cycle, the read module 26 determines whether voltage levels of the memory cells are higher or lower compared to the reference voltage v4a. During a second and a third read cycles, reference voltages v4b and v4c, respectively, are applied. Based on the three read cycles, the estimation module 18 constructs four bin histograms A4, B4, C4 and D4, as illustrated in FIG. 4.

For example, a height of the bin histogram A4 is an indication of a number of memory cells for which the voltage levels are estimated to be less than the reference voltage v4b, a height of the bin histogram C4 is an indication of a number of memory cells for which the voltage levels are estimated to be between reference voltages v4a and v4b, a height of the bin histogram D4 is an indication of a number of memory cells for which the voltage levels are estimated to be between reference voltages v4a and v4c, and a height of the bin histogram B4 is an indication of a number of memory cells for which the voltage levels are estimated to be greater than the reference voltage v4c.

In an embodiment, the bin histogram memory module 30 stores bin indices for various bin histograms. The bin indices in the bin histogram memory 30 are dynamically updated as results of new read cycles are available. In an embodiment, the LLR table module 34 includes a look up table (LUT) that maps bin indices of bin histograms to the corresponding LLRs. In an embodiment, magnitude of LLRs assigned to various bin histograms are based on the height of the respective bin histograms (i.e., based on the corresponding bin indices). As an example, the higher is a bin index of a bin histogram, the higher is a magnitude of the corresponding LLR (although the mapping may include more complex and different types of rules). For example, the bin histograms A4, B4, C4 and D4 are assigned LLR values of −2.5, −1, 0.8 and 3.4, respectively, as illustrated in FIG. 4.

Figure 5:
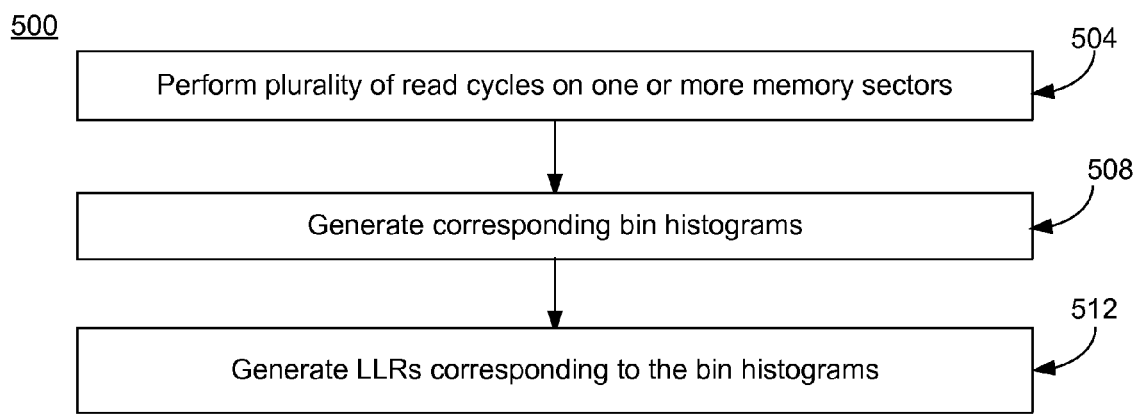
FIG. 5 illustrates an example of a method for assigning log-likelihood ratios (LLRs) to various ranges of reference voltages.

FIG. 5 illustrates an example of a method 500 for assigning LLRs to various ranges of reference voltages. At 504, a plurality of read cycles are performed (e.g., by the read module 26) on one or more memory sectors of the memory 14. At 508, bin histograms are generated based on the plurality of read cycles (e.g., as discussed with respect to FIGS. 2-4). For example, the bin indices (e.g., stored in the bin histogram memory module 30) corresponding to the bin histograms are updated as results of new read cycles are available. At 512, LLRs are assigned (e.g., as discussed with respect to FIG. 4) to various bin histograms (e.g., based on the LLR table module 34) for various ranges of reference voltages.

As previously alluded to, a floating-gate transistor of a memory cell of the memory 14 is capable of storing a voltage on its floating gate for a period, typically many years. The threshold voltages that correspond to the stored charge on the floating gate of the floating-gate transistor will change over time due to, for example, physical changes in the memory 14. Such physical changes may result from aging, repeated erase and program cycles, and so forth of various memory sectors of the memory 14. A group of memory cells of the memory 14 will therefore exhibit a change in their overall threshold voltage distributions over time. For example, mean values of the threshold voltage distributions may shift with time, variance of the threshold voltage distributions may increase over time, and/or the threshold voltage distributions may become asymmetrical over time. Such changes may result in greater read error rates, which may worsen as the memory 14 ages. Additionally, there are generally variations between threshold voltage distributions of two memories (e.g., memory 14 and another memory) due to, for example, variations in manufacturing the two memories. Moreover, there may be variations between threshold voltage distributions of two memory sectors of the memory 14 due to, for example, relatively higher usage of one memory sector than the other, manufacturing variability, and/or the like. Additionally, if the memory cells of the memory 14 are MLCs, then each memory cell of the memory 14 has more than one bit stored (e.g., for a three bit MLC, a least significant bit (LSB), a center significant bit (CSB) and a most significant bit (MSB)). The threshold voltage distributions corresponding to the LSBs, CSBs and MSBs may also be different, requiring individual calibration and adaptation for the LLR values.

In an embodiment, the LLR values for the memory 14 needs to be periodically calibrated and adapted to reflect the variations in the threshold voltage distributions, in order to achieve relatively lower error rate during read operations. The LLR values are based on reference voltages applied during the read cycles, and determining appropriate reference voltages are also a non-trivial task.

Figure 6:
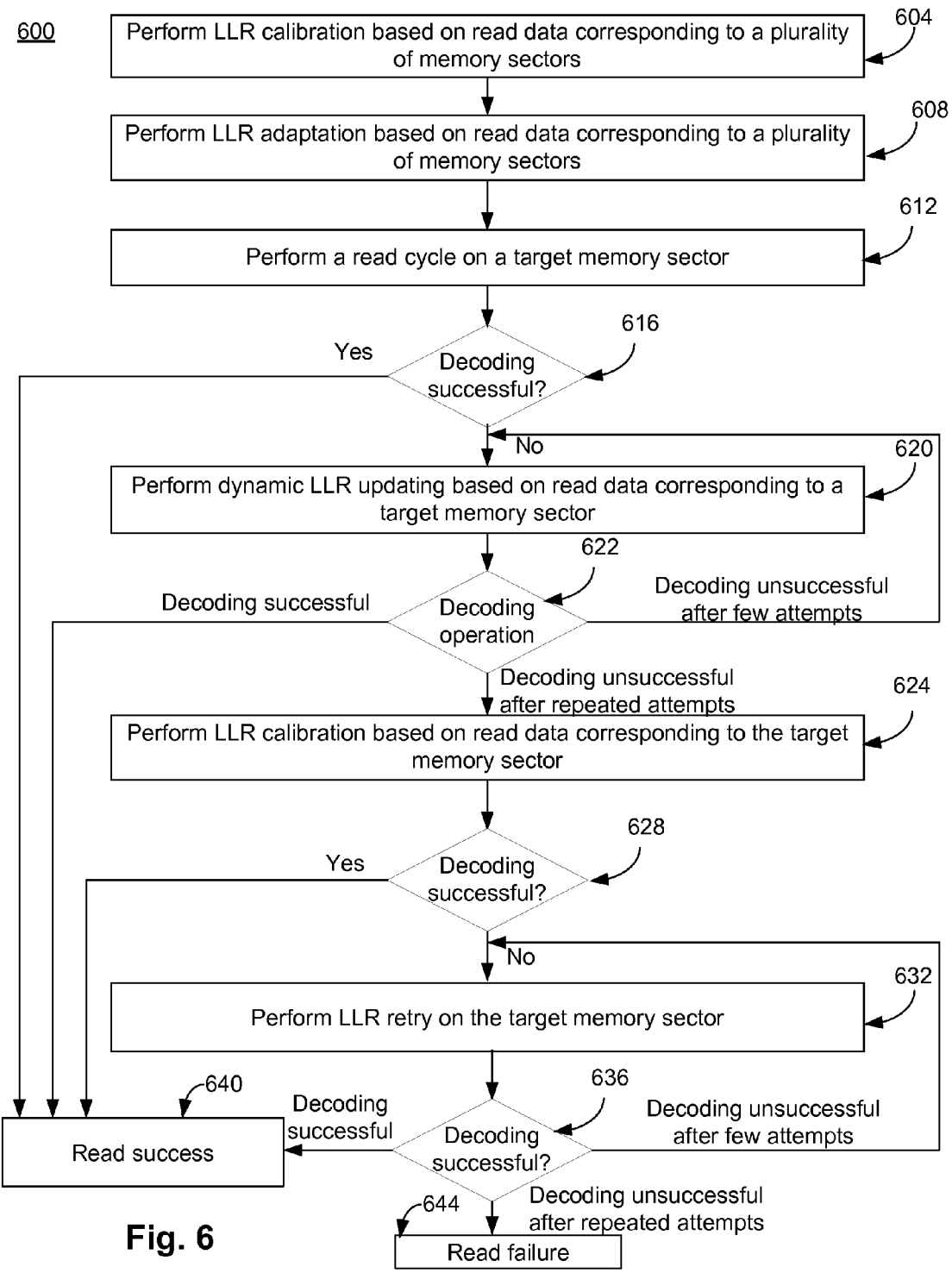
FIG. 6 illustrates an example of a method for performing a read operation of a memory sector of a memory.

FIG. 6 illustrates an example of a method 600 for performing a read operation of a memory sector of the memory 14. During the read operation of FIG. 6, the read control module 16 attempts to read data from, for example, a target memory sector of the memory 14. In an embodiment, the target memory sector is a memory page (e.g., a target memory page) of the memory 14 from which data is to be read. In an embodiment, data from all the memory cells of the target memory sector is read during a read cycle.

Referring to FIGS. 1 and 6, at 604, the read control module 16 (e.g., the estimation module 18 included in the read control module 16) performs an LLR calibration based on read data corresponding to a plurality of memory sectors of the memory 14. In an embodiment, the plurality of memory sectors corresponds to a group of memory sectors (e.g., a group of memory pages). The operation at 604 is performed, for example, during an initialization of the memory 14 (e.g., after manufacturing the memory 14, each time the memory 14 is powered on, etc.) and/or at periodic intervals. In an embodiment, the LLR calibration at 604 is performed offline. For example, the LLR calibration at 604 is performed during the initialization or power up of the memory 14 using, for example, dummy read operations (e.g., read operations performed solely for the LLR calibration process), before performing actual read operations of the memory 14.

While performing the LLR calibration at 604, in an embodiment, multiple read commands are issued for multiple memory sectors of the memory 14, and the associated histograms are generated (e.g., as discussed with respect to FIGS. 2-4). Additionally or alternatively, results from previous read commands are used to generate the histograms. During the LLR calibration at 604, the estimation module 18 estimates threshold voltage distributions for the various memory sectors (e.g., various threshold voltage distribution parameters, e.g., mean values, variances, etc. are estimated). Estimation of the threshold voltage distributions, while performing an LLR calibration, is discussed in more detail in U.S. patent application Ser. No. 12/552,925, filed Sep. 2, 2009, the entire disclosure of which is hereby incorporated by reference in its entirety except for those sections, if any, that are inconsistent with this disclosure.

While performing the LLR calibration at 604 and based on the estimated threshold voltage distributions, one or more desired (e.g., optimal or near optimal) reference voltages are also estimated for future read operations. For example, if only a single read cycle is to be carried out (e.g., if decoding is successful after one read cycle), only a single reference voltage is needed for the read operation. If two read cycles are to be carried out, two reference voltages are needed for the read operation, and so on. The estimation module 18 generates reference voltages for one read cycle, two read cycles, three read cycles, and/or any other appropriate number of read cycles (e.g., four, five, or the like). The estimation module 18 also generates LLRs for various ranges of reference voltages by calibrating and/or updating the LLR table 34 and based on the associated bin histogram indices.

Figure 7:
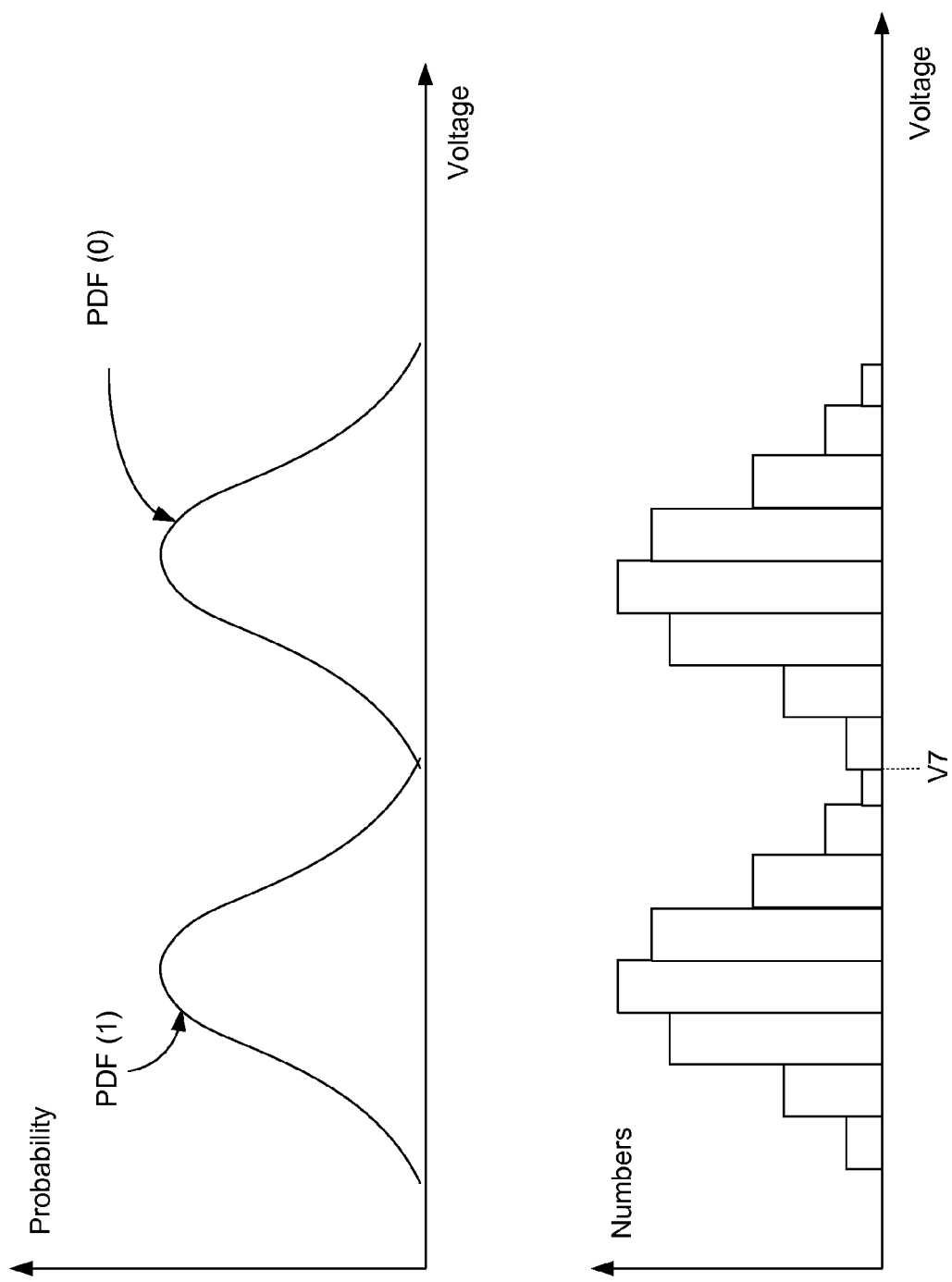
FIG. 7 schematically illustrates PDFs associated with probabilities of data bits being 0 or 1, as a function of voltage, and also illustrates corresponding bin histograms.

FIG. 7 schematically illustrates PDFs associated with probabilities of data bits being 0 or 1, as a function of voltage, and also illustrates corresponding bin histograms. The graphs of FIG. 7 are used for estimation of desired reference voltages and associated LLRs. The bin histograms of FIG. 7 are generated, for example, while performing the LLR calibration operation at 604. From the bin histograms of FIG. 7, voltage v7 is estimated to be a desired (e.g., an optimal or near optimal) reference voltage for a single read cycle during a future read operation on the memory 14. The LLRs associated with the reference voltage v7 is generated, for example, from the histograms of FIG. 7, using the LLR table 34 of FIG. 1.

Estimation of the desired reference voltages, while performing a LLR calibration, is discussed in more detail in U.S. patent application Ser. No. 13/167,896, filed Jun. 24, 2011, the entire disclosure of which is hereby incorporated by reference in its entirety except for those sections, if any, that are inconsistent with this disclosure.

Referring again to FIG. 6, at 608, the estimation module 18 performs LLR adaptation based on read data corresponding to a plurality of memory sectors (e.g., a group of memory sectors, which corresponds, for example, to a group of memory pages). In an example, while the LLR calibration at 604 is performed offline, the LLR adaptation at 608 is performed online (e.g., during general use (e.g., general read operations) of the memory 14), e.g., as and when results of new read data are available to the estimation module 18. In an embodiment, LLR adaptation at 608 reflects change in the threshold voltage distribution, based on decoding data from the decoder module 22 (e.g., hard decoding and/or soft decoding data from the decoder module 22). During the LLR adaptation at 608, the desired (e.g., optimal or near optimal) values of the reference voltages (which were initially determined during the LLR calibration at 604) are updated, along with updating of the corresponding LLR values (e.g., based on bin histograms associated with the reference voltages, where the bin histograms are also updated during the LLR adaptation at 608). LLR adaptation is discussed in more detail in U.S. patent application Ser. No. 13/017,430, filed Jan. 31, 2011, the entire disclosure of which is hereby incorporated by reference in its entirety except for those sections, if any, that are inconsistent with this disclosure.

In an embodiment, the LLR calibration and/or the LLR adaptation is performed on a group of memory cells. As an example, the memory 14 is divided in a plurality of groups of memory sectors. Such division is based on, for example, duration of time that has elapsed from the last time data were written to memory cells of individual memory sectors. As an example, memory sectors of the memory 14, to which data were last written one month before, form a first group of memory sector; memory sectors of the memory 14, to which data were last written two months before, form a second group of memory sector, and so on. In an embodiment, each memory sector of a group of memory sectors may exhibit to some extent similar change in the threshold voltage distributions (as data were written to each of these memory sectors at substantially similar times). Accordingly, information received from reading one or more memory sectors of a group of memory sectors are used to perform LLR adaptation and/or LLR calibration of 608 and/or 604, respectively, for other memory sectors of the group of memory sectors.

Referring again to FIG. 6, at 612, the read module 26 performs a read cycle on the target memory sector. The read cycle is performed, for example, using the desired reference voltages, which were determined and/or updated during the LLR calibration at 604 and/or LLR adaption at 608. Although not illustrated in FIG. 6, at 612, the decoder module 22 decodes (e.g., ECC decoding using an appropriate soft decoding algorithm and/or hard decoding) data read by the read module 26, using LLR estimations generated by the estimation module 18 during the LLR calibration at 604 and/or LLR adaption at 608.

In an embodiment, the target memory sector is included in the previously discussed first group of memory sectors. The reference voltages and LLRs used at 612 for the read cycle on the target memory sector is determined during the LLR calibration and/or LLR adaption, based on information received during reading other memory sectors of the first group of memory sectors.

At 616, the decoder module 22 determines if the decoding of data, read from the target memory sector at 612, is successful. If decoding is successful, at 640, the read control module 16 successfully completes reading the target memory sector.

If, at 616, the decoding is not successful, at 620 the read control module 16 performs a dynamic LLR updating. As previously discussed, the LLR calibration at 604 and/or the LLR adaption at 608 are performed based on read data from a plurality of memory sectors. However, the target memory cell (on which the read operation is being performed) may have characteristics (e.g., threshold voltage distributions) that are substantially different from other memory sectors of the plurality of memory sectors of the memory 14 (e.g., including memory sectors of a group of memory sector to which the target memory sector belongs). Such differences may be due to, for example, manufacturing variations, over-usage of the target memory sector, and/or the like. That is, the target memory sector may be an out-liner in the plurality of memory sectors of the memory 14 (i.e., the target memory sector may have substantially different threshold voltage distribution compared to an average threshold voltage distributions of various other memory sectors).

In an embodiment, the dynamic LLR updating at 620 is performed using read data corresponding to the target memory sector and/or using the current codeword, where the read data is read anew using a set of reference voltages of higher resolution. For example, read data (e.g., new read data) from the target memory sector (and/or read data using the current codeword) is used to update the desired reference voltages and/or the associated LLRs. As an example, during the dynamic LLR updating, three read cycles, with three different reference voltages, are performed on the target memory sector, and the desired reference voltages and the LLRs are dynamically updated based on the results of the three read cycles. Subsequently, a read cycle is repeated using the updated desired reference voltages and a decoding is performed using the corresponding updated LLRs.

At 622, it is determined if the decoding is successful. If successful, the method ends at 640. If decoding is unsuccessful, the read control module 16 may decide to perform the dynamic LLR updating with a few more (e.g., one, two, or other appropriate number) read cycles, with corresponding new reference voltages of higher resolutions, and, at 628, check if the decoding is successful once again.

Dynamic LLR updating (e.g., by performing one or more read cycles, with one or more corresponding reference voltages, for the target memory sector) is discussed in more detail in U.S. patent application Ser. No. 13/089,135, filed Apr. 8, 2011, the entire disclosure of which is hereby incorporated by reference in its entirety except for those sections, if any, that are inconsistent with this disclosure. Dynamic LLR updating (e.g., repeating the dynamic LLR updating by performing another one or more read cycles, with another one or more corresponding reference voltages, for the target memory sector) is also discussed in more detail in U.S. patent application Ser. No. 13/167,896, filed Jun. 24, 2011, the entire disclosure of which is hereby incorporated by reference in its entirety except for those sections, if any, that are inconsistent with this disclosure.

Referring again to FIG. 6, if decoding is unsuccessful at 622 after repeated attempts, at 624, the read control module 16 performs LLR calibration based on read data corresponding to the target memory sector. In an embodiment, the LLR calibration at 624 is similar to the LLR calibration at 604. However, unlike the LLR calibration at 604, the LLR calibration at 624 is performed based on read data from the target memory sector. For example, the LLR calibration at 604 is performed based on read data from the plurality of memory sectors. If previous read data (which were used for the LLR calibration at 604) is available for the target memory sector, such read data is used for specifically performing the LLR calibration for the target memory sector at 624. For example, the desired reference voltages and the associated LLRs, for performing read operations of the target memory sector, are updated based on the LLR calibration at 624. In an embodiment, the LLR calibration at 624 is performed using new read data corresponding to the target memory sector and/or read data corresponding to the target memory sector that are available from one or more previous read cycles. Performing a LLR calibration is discussed in more detail in U.S. patent application Ser. No. 12/552,925, filed Sep. 2, 2009, the entire disclosure of which is hereby incorporated by reference in its entirety except for those sections, if any, that are inconsistent with this disclosure.

Subsequent to performing the LLR calibration at 624, the read cycle is repeated on the target memory sector using the updated desired reference voltages and the corresponding LLR values. At 628, the decoder module 22 determines if the associated decoding operation is successful. If the decoding is successful, the method ends at 640.

If the decoding is unsuccessful at 628, at 632, the read control module 16 performs LLR retry on the target memory sector. During the LLR retry at 632, read cycles are repeated using a plurality of reference voltages. Additionally or alternatively, the decoding module 32 attempts to decode the read data using a plurality of LLR values. The decoder module 22 checks, after every read cycle and/or after using various LLR values, if decoding is successful at 636. If successful, the method ends at 640. If decoding is unsuccessful after few attempts, the LLR retry is repeated until decoding is successful. If decoding is unsuccessful after repeated attempts (e.g., after repeating for a threshold number of times, and/or for a threshold duration of time), the read control module 16 declares at 644 a failure to read the target memory sector.

In an embodiment, LLR retry is performed using at least in part recent successful LLR retry history (e.g., from the target sector and/or other memory sectors). LLR retry, using recent successful LLR retry history (e.g., from the target sector and/or other memory sectors) is discussed in more detail in U.S. patent application Ser. No. 12/959,891, filed Dec. 3, 2010, the entire disclosure of which is hereby incorporated by reference in its entirety except for those sections, if any, that are inconsistent with this disclosure.

Figure 8:
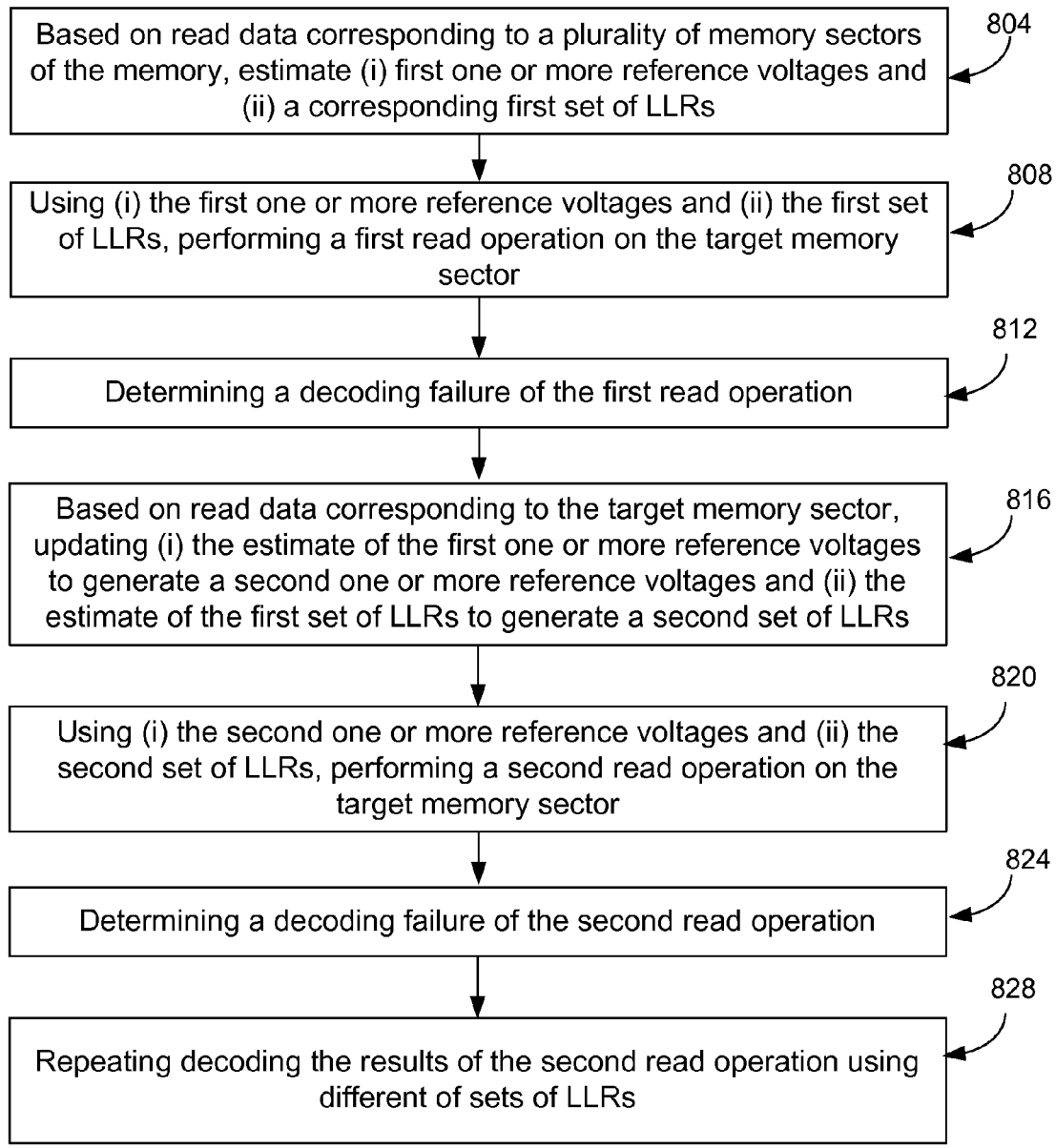
FIG. 8 illustrates another example of a method for performing a read operation of a memory sector of a memory.

FIG. 8 illustrates an example of a method 800 for performing a read operation of a memory sector (e.g., a target memory sector) of a memory. At 804, based on read data corresponding to a plurality of memory sectors of a memory (e.g., memory 14), the estimation module 18 estimates (i) first one or more reference voltages and (ii) a corresponding first set of LLRs. Such estimation may be performed, for example, in accordance with the LLR calibration and/or LLR adaptation discussed at 604 and 608, respectively, of the method 600 of FIG. 6.

At 808, using the first one or more reference voltages, the read module 26 performs a first read operation on the target memory sector, and the decoder module 22 decodes the results of the first read operation using the first set of LLRs. At 812, the read module 26 and/or the decoder module 22 determines a decoding failure of the first read operation (e.g., a failure of the decoder operation associated with the first read operation).

At 816, based on read data corresponding to the target memory sector, the estimation module updates (i) the estimate of the first one or more reference voltages to generate a second one or more reference voltages and (ii) the estimate of the first set of LLRs to generate a second set of LLRs. Such updating may be performed, for example, in accordance with the dynamic LLR updating and/or LLR calibration discussed at 620 and 624, respectively, of the method 600 of FIG. 6.

At 820, using the second one or more reference voltages, the read module 26 performs a second read operation on the target memory sector, and the decoder module 22 decodes the results of the second read operation using the second set of LLRs. At 824, the read module 26 and/or the decoder module 22 determines a decoding failure of the second read operation (e.g., a failure of the associated decoding operation by the decoder module 22). At 828, the decoder module 22 repeats decoding the results of the second read operation using different sets of LLRs. In an embodiment, decoder module 22 repeats decoding the results of the second read operation until one or more of the following occurs: (i) the decoding is successful, (ii) the decoding is repeated for a threshold number of times, and (iii) the repeated decoding is performed for at least a threshold duration of time. Such updating may be performed, for example, in accordance with the LLR retry discussed at 632 of the method 600 of FIG. 6.

In accordance with an embodiment, an article of manufacture may be provided that includes a storage medium having instructions stored thereon that, if executed, result in the operations described herein with respect to the methods 500, 600 and/or 800 of FIGS. 5, 6 and 8, respectively (and/or various other operations discussed in the present disclosure). In an embodiment, the instructions, if executed, result in the operations performed by the memory system 10 of FIG. 1. In an embodiment, the storage medium comprises some type of non-transitory memory (not shown). In accordance with various embodiments, the article of manufacture may be a computer-readable medium such as, for example, software or firmware.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description may use the terms "embodiment" or "embodiments," which may each refer to one or more of the same or different embodiments. Furthermore, the terms "comprising," "including," "having," and the like, as used with respect to embodiments, are synonymous.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope. Those with skill in the art will readily appreciate that embodiments may be implemented in a very wide variety of ways. This application is intended to cover any adaptations or variations of the embodiments discussed herein. Therefore, it is manifestly intended that embodiments be limited only by the claims and the equivalents thereof.

What is claimed is:

1. A method for reading a target memory sector of a memory, wherein the memory comprises a plurality of memory sectors, and wherein the plurality of memory sectors comprises the target memory sector, the method comprising:
    based on read data corresponding to the plurality of memory sectors of the memory, estimating first one or more reference voltages;
    using the first one or more reference voltages to perform a first read operation on the target memory sector;
    determining a decoding failure of the first read operation;
    in response to determining the decoding failure of the first read operation and based on read data corresponding to only the target memory sector of the plurality of memory sectors of the memory, updating the estimate of the first one or more reference voltages to generate second one or more reference voltages; and
    using the second one or more reference voltages to perform a second read operation on the target memory sector.

2. The method of claim 1, wherein updating the estimate of the first one or more reference voltages to generate the second one or more reference voltages further comprises:
    refraining from using read data from any memory sector of the plurality of memory sectors of the memory, other than the target memory sector.

3. The method of claim 1, wherein estimating the first one or more reference voltages further comprises:
    identifying a first subset of the plurality of memory sectors, wherein the first subset of the plurality of memory sectors includes the target memory sector; and based on read data corresponding to only the first subset of the plurality of memory sectors, estimating the first one or more reference voltages.

4. The method of claim 3, wherein identifying the first subset of the plurality of memory sectors further comprises:
identifying the first subset of the plurality of memory sectors such that data in each of the first subset of the plurality of memory sectors were last written during a first time period.

5. The method of claim 3, wherein identifying the first subset of the plurality of memory sectors further comprises:
identifying the first subset of the plurality of memory sectors such that for each memory sector in the first subset of the plurality of memory sectors, a time elapsed since data was last written in corresponding the memory sector is within a first time range.

6. The method of claim 1, wherein updating the estimate of the first one or more reference voltages further comprises:
in response to determining the decoding failure of the first read operation, performing a plurality of read operations on the target memory sector to generate current read data corresponding to only the target memory sector; and
based on the current read data corresponding to only the target memory sector, updating the estimate of the first one or more reference voltages to generate the second one or more reference voltages.

7. The method of claim 1, further comprising:
based on the read data corresponding to the plurality of memory sectors, estimating a first set of log-likelihood ratios (LLRs) corresponding to the first one or more reference voltages, wherein an LLR is an indication of a confidence for each data bit read from a memory cell for a given range of reference voltages,
wherein determining the decoding failure of the first read operation further comprises determining the decoding failure of the first read operation while decoding the results of the first read operation using the first set of LLRs,
wherein the method further comprises in response to determining the decoding failure of the first read operation and based on the read data corresponding to only the target memory sector of the plurality of memory sectors of the memory, updating the estimate of the first set of LLRs to generate a second set of LLRs, and
wherein performing the second read operation further comprises decoding the results of the second read operation using the second set of LLRs.

8. The method of claim 7, further comprising:
in response to determining a decoding failure of the second read operation while decoding the results of the second read operation using the second set of LLRs, decoding the results of the second read operation using a third set of LLRs.

9. The method of claim 8, further comprising:
repeating decoding the results of the second read operation using different sets of LLRs, until one or more of the following occurs: (i) the decoding is successful, (ii) the decoding is repeated for a threshold number of times, and (iii) the decoding is repeated for at least a threshold duration of time.

10. The method of claim 1, wherein the memory is a flash memory.

11. A memory system comprising:
a memory comprising a plurality of memory sectors, wherein the plurality of memory sectors of the memory comprises a target memory sector from which data is to be read;
a read module;
an estimation module configured to, based on read data corresponding to the plurality of memory sectors of the memory, estimate first one or more reference voltages; and
a decoder module,
wherein the read module is configured to perform, using the first one or more reference voltages, a first read operation on the target memory sector of the memory,
wherein in response to the decoder module determining a decoding failure of the first read operation and based on read data corresponding to only the target memory sector, the estimation module is further configured to update the estimate of the first one or more reference voltages to generate second one or more reference voltages, and
wherein using the second one or more reference voltages, the read module is further configured to perform a second read operation on the target memory sector.

12. The memory system of claim 11, wherein the estimation module is configured to refrain from using read data from any memory sector of the plurality of memory sectors of the memory, other than the target memory sector, while updating the estimate of the first one or more reference voltages to generate the second one or more reference voltages.

13. The memory system of claim 11, wherein the estimation module is configured to estimate the first one or more reference voltages by:
identifying a first subset of the plurality of memory sectors, wherein the first subset of the plurality of memory sectors includes the target memory sector; and
based on read data corresponding to only the first subset of the plurality of memory sectors, estimating the first one or more reference voltages.

14. The memory system of claim 13, wherein the estimation module is configured to identify the first subset of the plurality of memory sectors such that data in each of the first subset of the plurality of memory sectors were last written during a first time period.

15. The memory system of claim 13, wherein the estimation module is configured to identify the first subset of the plurality of memory sectors such that for each memory sector in the first subset of the plurality of memory sectors, a time elapsed since data was last written in corresponding the memory sector is within a first time range.

16. The memory system of claim 11, wherein:
in response to determining the decoding failure of the first read operation, the read module is further configured to perform a plurality of read operations on the target memory sector to generate current read data corresponding to the target memory sector; and
based on the current read data corresponding to the target memory sector, the estimation module is further configured to update the estimate of the first one or more reference voltages to generate the second one or more reference voltages.

17. The memory system of claim 11, wherein:
based on the read data corresponding to the plurality of memory sectors, the estimation module is further configured to estimate a first set of log-likelihood ratios (LLRs) corresponding to the first one or more reference voltages, wherein an LLR is an indication of a confidence for a given range of reference voltages;
the decoder module is further configured to decode results of the first read operation using the first set of LLRs;
in response to the decoder module failing to decode results of the first read operation using the first set of LLRs and based on the read data corresponding to only the target memory sector, the estimation module is further configured to update the estimate of the first set of LLRs to generate a second set of LLRs; and using the second set of LLRs, the decoder module is further configured to decode results of the second read operation.

18. The memory system of claim 17, wherein:

in response to determining a decoding failure of the second read operation while decoding the results of the second read operation using the second set of LLRs, the decoder module is further configured to decode the results of the second read operation using a third set of LLRs.

19. The memory system of claim 18, wherein:

the decoder module is further configured to repeat decoding the results of the second read operation using different sets of LLRs, until one or more of the following occurs: (i) the decoding is successful, (ii) fill the decoding is repeated for a threshold number of times, and (iii) the decoding is repeated for at least a threshold duration of time.

20. The memory system of claim 11, wherein the memory is a flash memory.

* * * * *